(12) United States Patent
Kawahara et al.

(10) Patent No.: US 9,653,342 B2
(45) Date of Patent: May 16, 2017

(54) TRENCH HAVING THICK DIELECTRIC SELECTIVELY ON BOTTOM PORTION

(71) Applicant: Texas Instruments Incorporated, Dallas, TX (US)

(72) Inventors: Hideaki Kawahara, Plano, TX (US); Hong Yang, Richardson, TX (US); Christopher Boguslaw Kocon, Mountain Top, PA (US); Yufei Xiong, Chengdu (CN); Yunlong Liu, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/548,029

(22) Filed: Nov. 19, 2014

(65) Prior Publication Data

US 2016/0141204 A1    May 19, 2016

(51) Int. Cl.

| | |
|---|---|
| *H01L 21/762* | (2006.01) |
| *H01L 21/28* | (2006.01) |
| *H01L 21/765* | (2006.01) |
| *H01L 29/40* | (2006.01) |
| *H01L 29/423* | (2006.01) |
| *H01L 29/66* | (2006.01) |
| *H01L 29/78* | (2006.01) |
| *H01L 29/94* | (2006.01) |
| *H01L 29/417* | (2006.01) |

(52) U.S. Cl.
CPC .. *H01L 21/76224* (2013.01); *H01L 21/28008* (2013.01); *H01L 21/765* (2013.01); *H01L 29/407* (2013.01); *H01L 29/42368* (2013.01); *H01L 29/66727* (2013.01); *H01L 29/66734* (2013.01); *H01L 29/7802* (2013.01); *H01L 29/7813* (2013.01); *H01L 29/41766* (2013.01); *H01L 29/945* (2013.01)

(58) Field of Classification Search
CPC ......... H01L 21/76224; H01L 21/28008; H01L 21/765; H01L 28/90; H01L 29/407
USPC ........................................................ 438/244
See application file for complete search history.

(56) References Cited

U.S. PATENT DOCUMENTS

| | | |
|---|---|---|
| 5,447,884 A | 9/1995 | Fahey et al. |
| 2007/0210363 A1* | 9/2007 | Cheng ............... H01L 27/10841 257/296 |
| 2008/0166846 A1* | 7/2008 | Marchant ............ H01L 29/7813 438/270 |

(Continued)

*Primary Examiner* — Moazzam Hossain
*Assistant Examiner* — Omar Mojaddedi
(74) *Attorney, Agent, or Firm* — Jacqueline J. Garner; Charles A. Brill; Frank D. Cimino

(57) ABSTRACT

A method of fabricating a semiconductor device includes etching a semiconductor substrate having a top surface to form a trench having sidewalls and a bottom surface that extends from the top surface into the semiconductor substrate. A dielectric liner of a first dielectric material is formed on the bottom surface and sidewalls of the trench to line the trench. A second dielectric layer of a second dielectric material is deposited to at least partially fill the trench. The second dielectric layer is partially etched to selectively remove the second dielectric layer from an upper portion of the trench while preserving the second dielectric layer on a lower portion of the trench. The trench is filled with a fill material which provides an electrical conductivity that is at least that of a semiconductor.

14 Claims, 5 Drawing Sheets

(56) References Cited

U.S. PATENT DOCUMENTS

| | | | |
|---|---|---|---|
| 2009/0050959 A1* | 2/2009 | Madson | H01L 29/7813 |
| | | | 257/332 |
| 2013/0032912 A1 | 2/2013 | Chen et al. | |
| 2013/0323921 A1* | 12/2013 | Burke | H01L 21/02164 |
| | | | 438/589 |
| 2013/0328160 A1* | 12/2013 | Ota | H01L 27/04 |
| | | | 257/506 |

* cited by examiner

TRENCH HAVING THICK DIELECTRIC SELECTIVELY ON BOTTOM PORTION

FIELD

Disclosed embodiments relate to filled dielectrically lined trench structures for semiconductor devices.

BACKGROUND

Some trench structures include a dielectric liner filled with a doped semiconductor or an electrical conductor. For certain uses, the dielectric liner needs to support significant electrical field strengths, for example, when trenches are used for trench field type metal-oxide-semiconductor field-effect transistors (MOSFETs) or trench gate type MOSFETs which both operate at significant operating voltages. One way to sustain higher breakdown voltages for such trench structures is to increase the thickness the dielectric liner or use a relatively high refractive index liner material.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for dielectrically lined trench structures although increasing the thickness the dielectric liner or using a relatively high refractive index liner material raises the operating voltage the trench dielectric can sustain, there is trade-off for some devices. For example, for trench gate-type MOSFETs and trench field plate type planar gate MOSFETs there is a tradeoff between breakdown voltage and ON-state resistance attributed to the charge balance between the trench dielectric liner and the substrate material (e.g., silicon). Typically, reduced dielectric (e.g. oxide) thickness is preferred for a charge balance improvement but may cause reliability or a high E-field concern especially at the trench bottom corner. Increased dielectric thickness can reduce such kinds of risk, but introduces the difficulty to keep charge balance for an appropriate breakdown voltage. Disclosed trench structures includes both a conventional dielectric trench liner comprising a first dielectric material (e.g., silicon oxide) a second dielectric material (e.g., SiN) at only the bottom of the trench to increase total dielectric thickness only at the bottom of the trench.

BRIEF DESCRIPTION OF THE DRAWINGS

Reference will now be made to the accompanying drawings, which are not necessarily drawn to scale, wherein.

DETAILED DESCRIPTION

Figure 1:
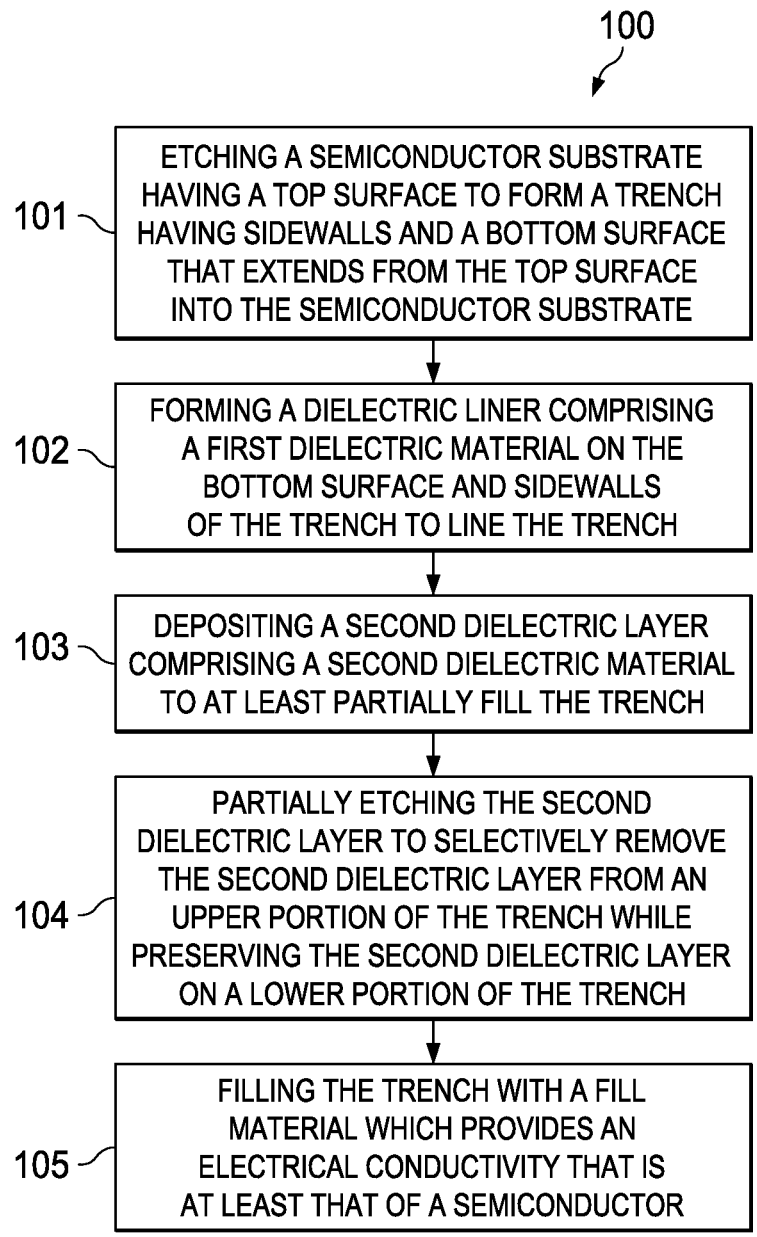
FIG. 1 is a flow chart that shows steps in an example method for fabricating a semiconductor device including forming trenches having a thick dielectric selectively on its bottom portion, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for fabricating a semiconductor device including forming trenches having a thick dielectric selectively on its bottom portion, according to an example embodiment. Step 101 comprises etching a semiconductor substrate having a top surface to form a trench having sidewalls and a bottom surface that extends from the top surface into the semiconductor substrate. The substrate can be an epitaxial layer on a bulk semiconductor (e.g., silicon or comprising silicon), but can also be solely a bulk semiconductor. The trench depth is generally from 2 μm to 50 μm.

Step 102 comprises forming a dielectric liner comprising a first dielectric material on the bottom surface and sidewalls of the trench to line the trench. The dielectric liner can be thermally grown or deposited such as by low pressure chemical vapor deposition (LPCVD).

Step 103 comprises depositing a second dielectric layer comprising a second dielectric material to at least partially fill the trench. The trench filling is optionally a complete trench filling. The second dielectric material generally has a k-value ≥5. Silicon nitride is an example a second dielectric material, others examples include SiON, SiC, or other dielectric materials such as $HfO_2$, $ZrO_2$, $Al_2O_3$ and $HfSiO_3$.

Step 104 comprises partially etching the second dielectric layer to selectively remove the second dielectric layer from an upper portion of the trench while preserving the second dielectric layer on a lower portion of the trench. Wet or dry (e.g., plasma) processing can be used for this etch back process, and there is generally no need for a masking pattern. The length of the upper portion of the trench without the second dielectric layer is generally ≥a length of the lower portion of the trench with the second dielectric layer. A typical length ratio of the upper portion without the second dielectric layer to the lower portion with the second dielectric layer is >10:1.

Step 105 comprises filling the trench with a fill material which provides an electrical conductivity that is at least that of a semiconductor. In the case of a semiconductor fill material, the semiconductor may later in the process be doped. Examples of fill materials include polysilicon, and silicides such as tungsten silicide. The fill material is generally deposited and is then planarized to remove overburden fill materials, such as by chemical mechanical polishing (CMP). The fabrication process is then completed including implants, masking levels, depositions and diffusions forming gates, sources, drain, interconnects and bond pads, and passivation.

Figure 2A:
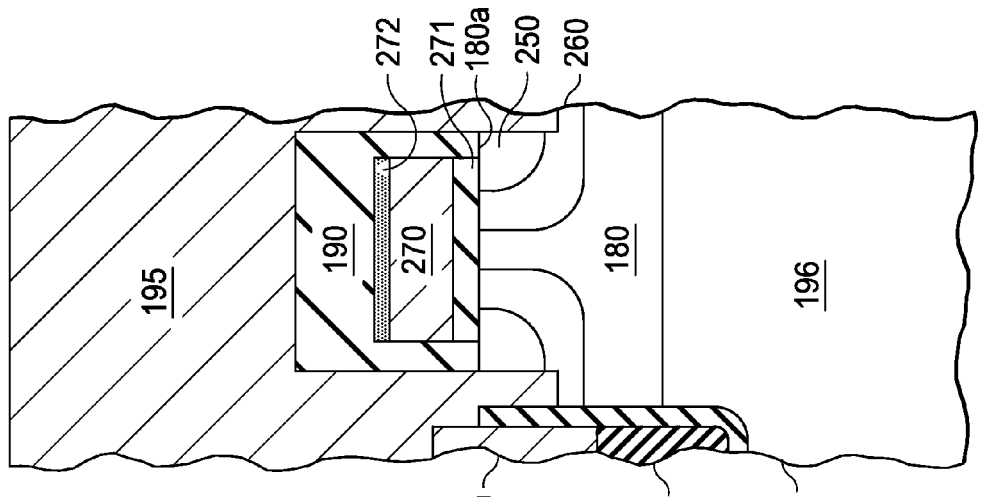
FIG. 2A is a cross section portion of a conventional trench field plate FET.

FIG. 2A is a cross section portion of a conventional trench field plate FET formed on an epitaxial semiconductor layer (epi layer) 180 on an n+ substrate 196. The FET shown includes a gate electrode 270 on a gate dielectric 271 that is on a top surface 180a of the epi layer 180. A silicide layer 272 is shown on the gate electrode 270 which will generally be present when the gate electrode 270 comprises polysilicon. The surface 180a of the epi layer 180 over the FET is shown covered with a dielectric film 190. The trench is shown including a dielectric liner 140 comprising a first dielectric material that is filled by a filler material 170. A source 250 and a body region 260 are shown formed in the epi layer 180. A source metal layer 195 is shown contacting the source 250, the body region 260, and the filler material 170.

Figure 2B:
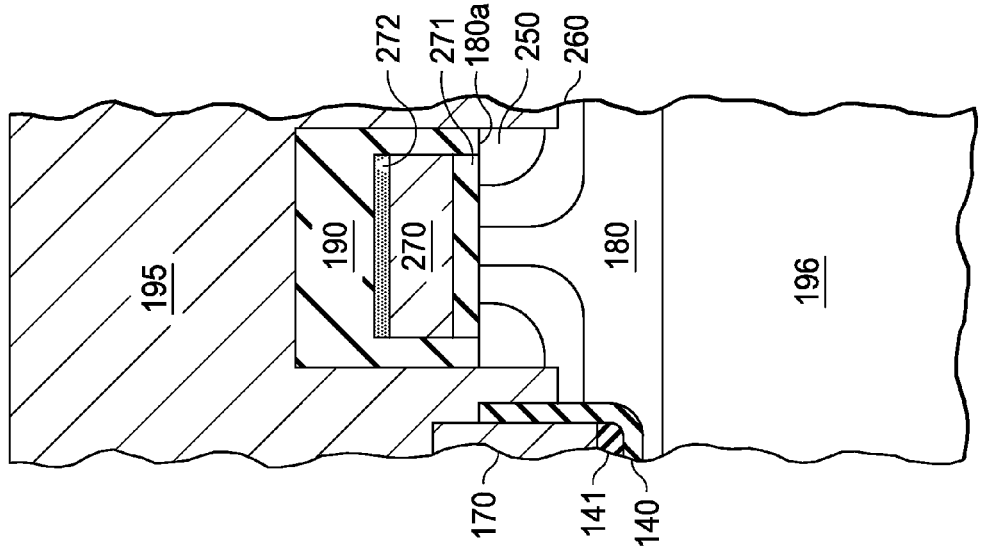
FIG. 2B is a cross section portion of a disclosed trench field plate FET including a trench having a thick dielectric selectively on its bottom portion, according to an example embodiment.

FIG. 2B is a cross section portion of a disclosed trench field plate FET including a trench having a thick dielectric selectively on its bottom portion, according to an example embodiment. A second dielectric layer 141 comprising a second dielectric material is shown only on a lower portion of the trench. The source metal layer 195 is again shown contacting the source 250, the body region 260, and the filler material 170.

Figure 2C:
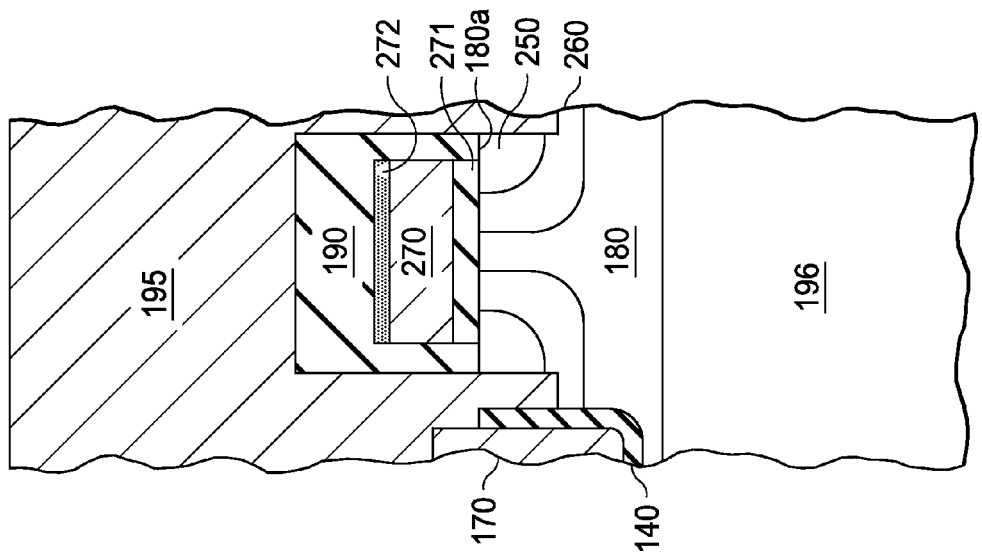
FIG. 2C is a cross section portion of a disclosed trench field plate FET including a trench having a thick dielectric selectively on its bottom portion that extends through an epitaxial layer into the underlying substrate, according to an example embodiment.

FIG. 2C is a cross section portion of a disclosed trench field plate FET including a trench having a thick dielectric selectively on its bottom portion that extends through the epi layer 180 into the underlying substrate 196, according to an example embodiment. The source metal layer 195 is again shown contacting the source 250, the body region 260, and the filler material 170.

Figure 2E:
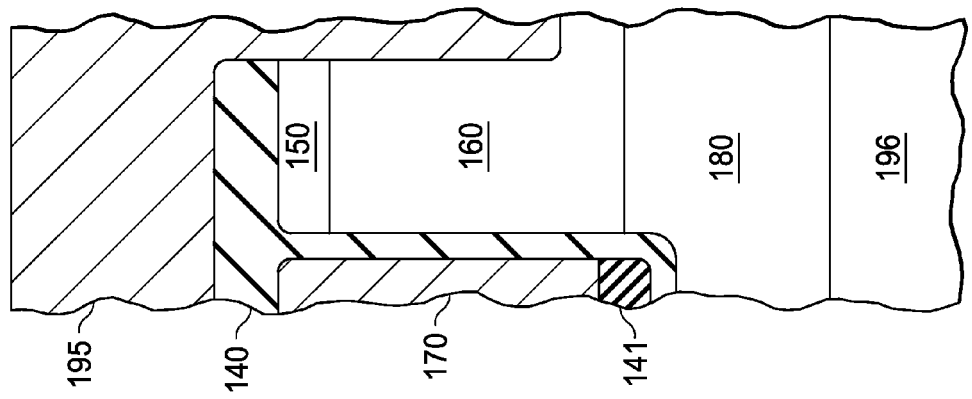
FIG. 2E is a cross section portion of a disclosed trench gate FET including a trench having a thick dielectric selectively on its bottom portion, according to an example embodiment.
Figure 2D:
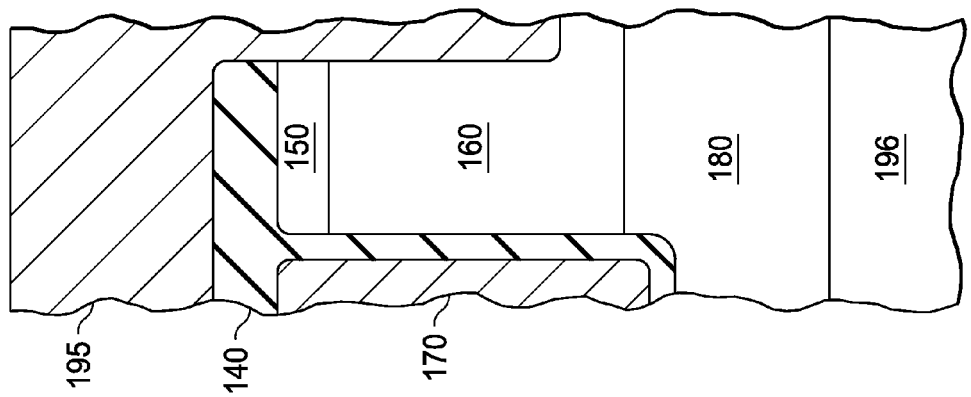
FIG. 2D is a cross section portion of a conventional trench gate FET.

FIG. 2D is a cross section portion of a conventional trench gate FET. The FET shown includes the filler material 170 as its gate electrode and the dielectric liner 140 as its gate dielectric layer. A source 150 and a body region 160 are shown formed in the epi layer 180. A source metal layer 195 is shown contacting the source 150 and body region 160. Although not shown in FIG. 2D or FIG. 2E described below, the filler material 170 is contacted by another metal (or polysilicon) pattern through vias cut in the dielectric film 190 shown in FIG. 3A that is over the filler material 170.

FIG. 2E is a cross section portion of a disclosed trench gate FET including a trench having a thick dielectric selectively on its bottom portion, according to an example embodiment. A second dielectric layer 141 comprising a second dielectric material is shown only on a lower portion of the trench.

Figure 3A:
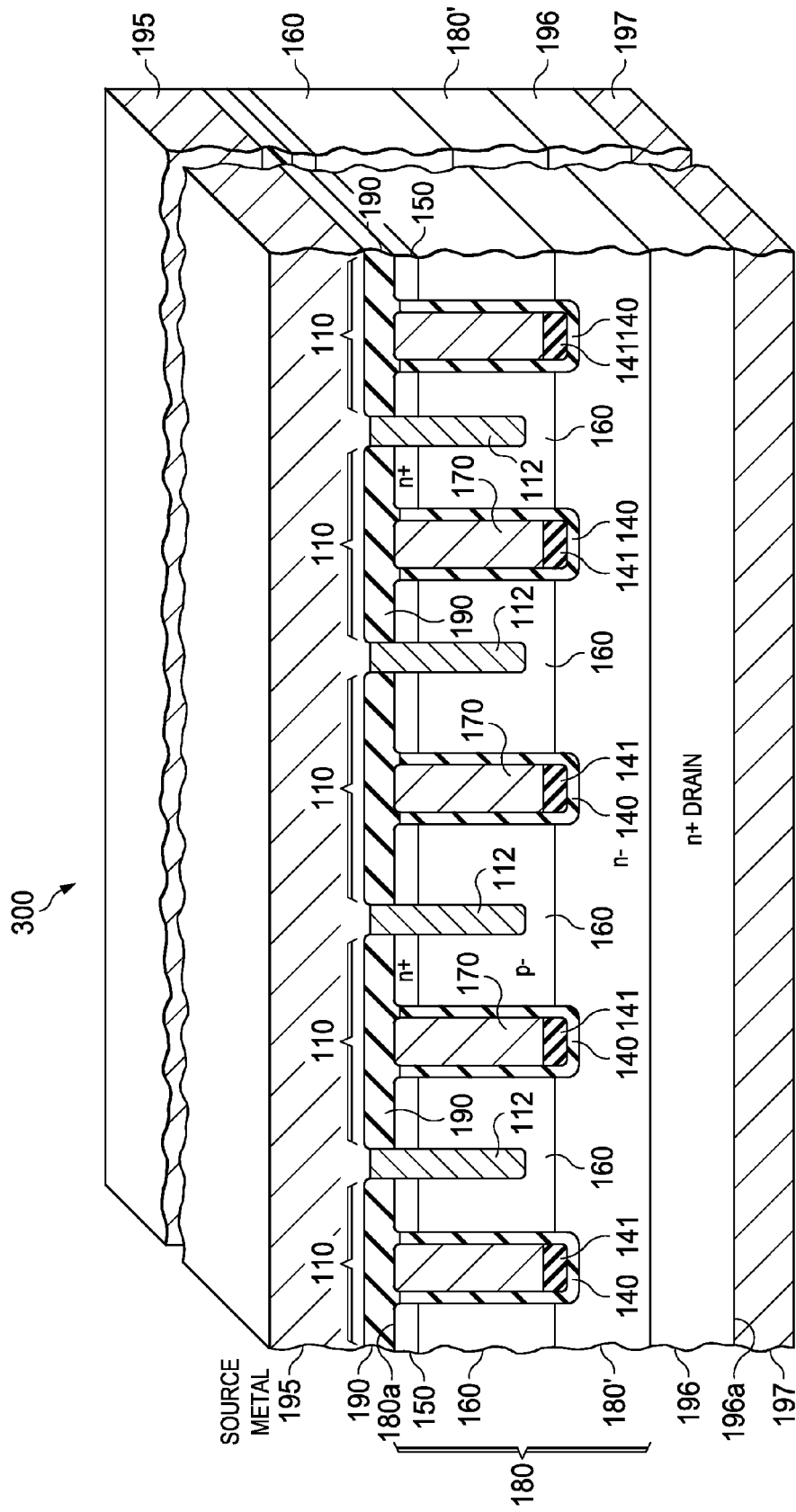
FIG. 3A depicts a cross sectional view of an example trench gate MOSFET including a plurality of transistor cells each including a disclosed trench having a thick dielectric selectively on its bottom portion, according to an example embodiment.

FIG. 3A depicts a cross sectional view of an example trench gate MOSFET 300 (trench gate MOSFET 300) shown as being an n-channel device (NMOS) including a plurality of transistor cells (cells) 110 each including a trench having thick dielectric selectively on its bottom portion, according to an example embodiment. Although generally described herein as being NMOS devices, disclosed MOSFET devices may also be PMOS. Moreover, in a practical device, there may be hundreds or thousands of cells hooked electrically in parallel. The trench portion of any of the cells 110 shown may be used for a trench isolation structure, field plate, or as a trench capacitor for a given semiconductor device. Although not shown in FIG. 3A, gate contacts and metal connections to the gate contacts are provided to provide electrical contact to the gate electrodes 170 of the cells 110.

Trench gate MOSFET 100 is formed on a substrate 196 shown as an n+ substrate that provides a drain for the device having an n− epitaxial semiconductor layer 180 thereon which provides an n− drain drift region. The n+ substrate 196/semiconductor layer 180 can comprise silicon; alternatively, the n+ substrate 196/epitaxial semiconductor layer 180 may comprise other semiconductor materials such as germanium, silicon carbide, gallium nitride, gallium arsenide, etc. A p− doped body region 160 is formed in the semiconductor layer 180, where n+ doped source regions 150 are formed at the surface 180a of the semiconductor layer 180 within the body regions 160.

Conductor filled dielectric lined gate trenches 170/140 provide the gate structure for the respective cells 110. The gate trench walls are lined with a dielectric film 140 (or liner) comprising a first dielectric material that functions as a gate dielectric. The trenches include a thick dielectric selectively on their bottom provided by the second dielectric layer 141 shown. In this embodiment, the dielectric film 140 can be silicon dioxide. Alternatively, the dielectric film 140 may comprise other dielectric material such as silicon nitride, or other dielectrics. The dielectric lined trenches are filled with polysilicon or other electrically conductive material such as tungsten to form the gate electrode 170 for the cells 110.

The gate trenches can be etched from the surface 180a of the epitaxial semiconductor layer 180. In this embodiment, the five depicted gate trenches can be processed concurrently with a pattern step and then an etch step. The trench gate MOSFET 300 in this embodiment can be formed by a process flow for conventional trench MOSFETs such as including ion implantation or dopant diffusion to form the body regions 160 and the source regions 150.

The surface 180a of the semiconductor layer 180 is shown covered with a dielectric film 190. In this embodiment, the dielectric film 190 can comprise silicon oxide or silicon oxynitride. Alternatively, the dielectric film 190 may comprise other dielectric materials as known in the art of semiconductor device fabrication.

As shown in FIG. 3A, the cells 110 also include source/body contact holes 112 which are formed through the top surface 180a of the semiconductor layer 180 between the gate trenches through the source regions 150 and the body regions 160. Although the source/body contact holes 112 are shown in FIG. 3A extending into the semiconductor layer 180, disclosed embodiments also include the option of having planar source/body contacts.

Once filled with an electrical conductor shown as source metal layer 195 the contact holes 112 short the source regions 150 to the body regions 160 of each of the cells 110. Source metal layer 195 can be more generally any electrically conductive material such as tungsten or doped polysilicon, which in operation is generally grounded.

The backside 196a of the n+ substrate 196 of the trench gate MOSFET 300 in FIG. 3A is shown covered with a separate metal film 197. This metal film 197 makes a low resistance ohmic contact to the n+ substrate 196 which provides the drain region, which in operation is connected to Vds. Alternatively, metal film 197 may be omitted and the backside 196a of the n+ substrate 196 may instead be mounted to a die pad of a leadframe. The gate electrodes 170 of the active transistor cells 110 are separately tied together by another metal or doped polycrystalline element (not shown) which is connected to the gate electrode terminal of the device package.

When trench gate MOSFET 300 is an enhancement device, provided the device is properly biased between gate and source, an inversion channel forms in the mesa region between the source region 150 and the drain drift region 180', adjacent to the dielectric film 140 that lines the trench walls. When an appropriate potential difference is established between the source terminal and the drain terminal, electrical current flows vertically through the channel. If the body region is doped more heavily with n-type dopant (PMOS), the current is carried through the channel by holes; if it is doped more heavily with p-type dopant (NMOS) as shown in FIG. 3A, electrons.

Figure 3B:
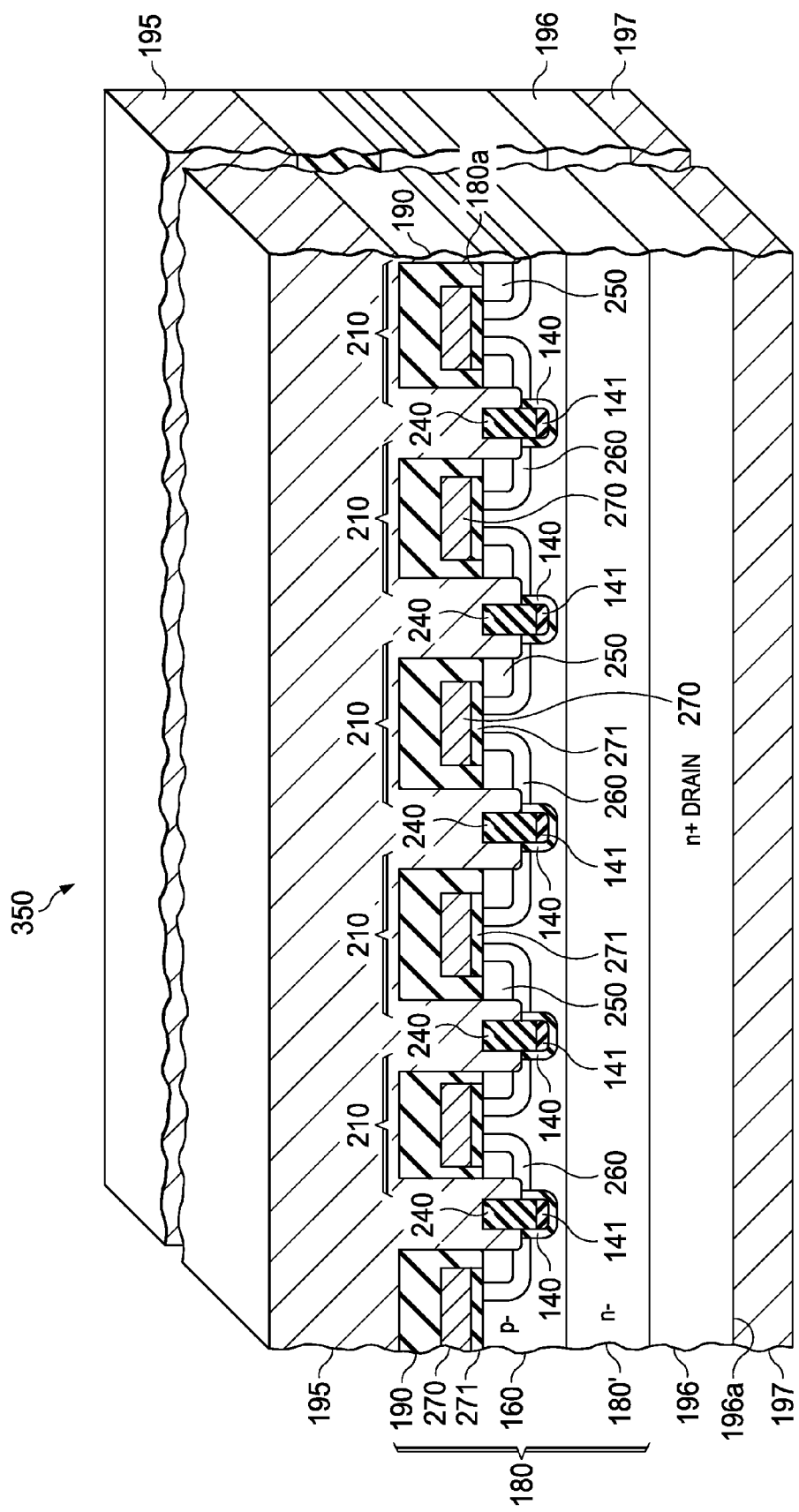
FIG. 3B depicts a cross sectional view of an example planar gate trench MOSFET including a plurality of active transistor cells each including a disclosed trench having a thick dielectric selectively on its bottom portion, according to an example embodiment.

FIG. 3B depicts a simplified cross-section view of an example planar gate trench MOSFET device 350 (planar gate trench MOSFET 350) including a plurality of transistor cells (cells) 210 each including a trench having thick dielectric selectively on its bottom portion, according to an example embodiment. The planar gate trench MOSFET 350 includes dielectric lined trenches with a polysilicon filler 240 lined by a dielectric liner 140 comprising a first dielectric material having a thick dielectric selectively on the bottom of the trench provided by the second dielectric layer 141 shown to provide field plates (sometimes referred to as "RESURF trenches) on both sides of the gate stacks for the cells 210. The cells 210 are shown having a gate stack comprising a gate electrode 270 on a gate dielectric 271. Although not shown in FIG. 3B, gate contacts and metal connections are provided to provide electrical contact to the gate electrodes 270 of the cells 210. An n+ doped source region 250 is on the top surface 180*a* of the semiconductor layer 180 between the gate stacks and the trenches, and the substrate 196 is shown as an n+ substrate which provides a drain for the device having an epi layer 180 thereon that provides a drain drift region 180'. Although a single gate is shown for each of the cells 210, the respective cells 210 may also have a split dual-gate. The planar gate trench MOSFET 350 in this embodiment can be formed by a process flow for conventional MOSFETs such as including ion implantation or diffusion to form the p-doped body regions 260 and source regions 250.

The surface 180*a* includes a dielectric layer 190 thereon. In this embodiment, the dielectric film material can be silicon dioxide. Alternatively, the dielectric film 190 may comprise other dielectric material such as silicon nitride or other dielectrics. The source metal layer 195 is shown contacting the polysilicon filler 240 in the dielectric lined trenches as well as the adjacent source 250 and body region 260.

The gate electrodes 270 for the active transistor cells 210 are separately tied together by another metallic or polysilicon element which is generally connected to the gate terminal of the device package. When the planar gate trench MOSFET 350 is an enhancement device, provided the device is properly biased, an inversion channel forms in the body region 260 under the gate 270. Electrical current flows through the channel when an electric field gradient is established between the source and the drain. If the body region is doped more heavily with n-type dopant (PMOS), the current is carried through the channel by holes; if it is doped more heavily with p-type dopant (NMOS), electrons.

Advantages of disclosed trench structures include enhancing the charge balance for specific ON-resistance (Rsp)-breakdown voltage (BV) trade-off without any degradation of reliability or high E-field concern at the bottom of trench.

As an example, for trench field MOSFETs, the output capacitance (Coss) can be reduced more than 20% without any performance degradation in Rsp, BV, or threshold voltage (Vt). For trench gate FETs, disclosed trenches reduce the gate to drain charge (Qgd) 50%, and Coss can be reduced 10% while keeping the same range of Rsp, BV and Vt.

Moreover, disclosed trenches increase the integrity between the substrate (e.g., silicon) and fill material (e.g., polysilicon) for trench gate FETs, and improve the operating voltage (Vop) for trench capacitors at the trench bottom where typically reliability is concerned due to a higher electric E-field. As noted above, disclosed trenches may also be used for isolation trenches, for example for shallow trench isolation (STI) and DEEP trench isolation.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of fabricating a semiconductor device, comprising:
   etching a semiconductor substrate having a top surface to form a trench having sidewalls and a bottom surface that extends from said top surface into said semiconductor substrate;
   forming a dielectric liner comprising a first dielectric material on said bottom surface and said sidewalls of said trench to line said trench;
   after forming the dielectric liner, depositing a second dielectric layer comprising a second dielectric material on the dielectric liner to at least partially fill said trench;
   partially etching said second dielectric layer to selectively remove said second dielectric layer from an upper portion of said trench while preserving said second dielectric layer on a lower portion of said trench and while preserving the dielectric liner in the upper portion of the trench and the lower portion of the trench, and
   filling said trench with a fill material which provides an electrical conductivity that is at least that of a semiconductor, wherein the dielectric liner lines the fill material in the trench.

2. The method of claim 1, wherein a length of said upper portion of said trench is greater than or equal to (≥) a length of said lower portion of said trench.

3. The method of claim 1, wherein said trench is a field plate associated with a planar gate metal-oxide-semiconductor field-effect transistor (MOSFET), wherein the planar gate is separated from the field plate.

4. The method of claim 1, wherein said trench is a trench gate for a trench gate metal-oxide-semiconductor field-effect transistor (MOSFET).

5. The method of claim 1, wherein said trench is a trench isolation structure for said semiconductor device.

6. The method of claim 1, wherein said trench is a trench capacitor for said semiconductor device.

7. The method of claim 1, wherein said semiconductor substrate comprises an epitaxial layer on a bulk substrate material, and wherein said trench extends into said bulk substrate material.

8. The method of claim 1, wherein said second dielectric material has a k-value≥5.

9. A method of fabricating a semiconductor device, comprising:
   etching a semiconductor substrate to form a trench having sidewalls and a bottom surface;
   forming a dielectric liner comprising a first dielectric material on the bottom surface and the sidewalls of the trench to line the trench;
   after forming the dielectric liner, depositing a second dielectric layer comprising a second dielectric material on the dielectric liner to at least partially fill the trench;
   partially etching the second dielectric layer to selectively remove the second dielectric layer from an upper portion of the trench while preserving the second dielectric layer on a lower portion of the trench, wherein the dielectric liner extends along the sidewalls of the trench above a top surface of the second dielectric layer after the partial etching; and
   with the dielectric liner extending along the sidewalls of the trench above the top surface of the second dielectric layer, filling the trench with polysilicon, wherein the dielectric liner lines the polysilicon in the trench.

10. The method of claim 9, wherein said trench is a field plate associated with a planar gate metal-oxide-semiconductor field-effect transistor (MOSFET), wherein the planar gate is separated from the field plate.

11. The method of claim 9, wherein said trench is a trench gate for a trench gate metal-oxide-semiconductor field-effect transistor (MOSFET).

12. The method of claim 9, wherein said trench is a trench isolation structure for said semiconductor device.

13. The method of claim 9, wherein said trench is a trench capacitor for said semiconductor device.

14. A method of fabricating a semiconductor device, comprising:
   forming a trench filed plate by:
      etching a semiconductor substrate to form a trench having sidewalls and a bottom surface;
      forming a dielectric liner comprising a first dielectric material on the bottom surface and the sidewalls of the trench to line the trench;
      depositing a second dielectric layer comprising a second dielectric material to at least partially fill the trench;
      partially etching the second dielectric layer to selectively remove the second dielectric layer from an upper portion of the trench while preserving the second dielectric layer on a lower portion of the trench, wherein the dielectric liner extends along the sidewalls of the trench above a top surface of the second dielectric layer after the partial etching; and
      with the dielectric liner extending along the sidewalls of the trench above the top surface of the second dielectric layer, filling the trench with polysilicon, wherein the dielectric liner lines the polysilicon in the trench; and
   forming a gate electrode on a gate dielectric that is on a top surface of the semiconductor substrate, wherein there is a space between the gate electrode and the polysilicon in the trench.

* * * * *